(12) United States Patent
Choi et al.

(10) Patent No.: US 8,831,691 B2
(45) Date of Patent: Sep. 9, 2014

(54) KEYPAD ASSEMBLY FOR PORTABLE RADIOTELEPHONE AND METHOD OF CONTROLLING THE SAME

(75) Inventors: Jae-Goo Choi, Kumi-shi (KR); Young Choi, Kumi-shi (KR)

(73) Assignee: Samsung Electronics Co., Ltd (KR)

( * ) Notice: Subject to any disclaimer, the term of this patent is extended or adjusted under 35 U.S.C. 154(b) by 1862 days.

(21) Appl. No.: 10/675,635

(22) Filed: Sep. 30, 2003

(65) Prior Publication Data

US 2004/0077373 A1    Apr. 22, 2004

(30) Foreign Application Priority Data

Oct. 18, 2002 (KR) ........................ 10-2002-0063778

(51) Int. Cl.
*H04M 1/00* (2006.01)
*H04M 1/23* (2006.01)
*H03K 17/96* (2006.01)
*H01H 13/702* (2006.01)

(52) U.S. Cl.
CPC ....... *H01H 13/702* (2013.01); *H01H 2239/006* (2013.01); *H03K 2217/96054* (2013.01); *H04M 1/23* (2013.01); *H03K 2217/960755* (2013.01); *H03K 17/962* (2013.01); *H04M 2250/22* (2013.01); *H01H 2231/022* (2013.01); *H01H 2225/03* (2013.01)
USPC .................. 455/575.1; 455/550.1; 455/556.1; 455/556.2; 345/156; 345/157; 345/158; 345/159; 345/160

(58) Field of Classification Search
USPC .......... 455/550.1, 556.1, 556.2; 345/156–184
See application file for complete search history.

(56) References Cited

U.S. PATENT DOCUMENTS

| 6,392,870 B1 * | 5/2002 | Miller, Jr. ................. 361/679.08 |
| 6,448,919 B1 * | 9/2002 | Claxton ........................ 341/155 |
| 6,518,958 B1 * | 2/2003 | Miyajima et al. ............. 345/173 |
| 6,924,789 B2 * | 8/2005 | Bick ............................. 345/168 |
| 2003/0185444 A1* | 10/2003 | Honda .......................... 382/186 |

FOREIGN PATENT DOCUMENTS

EP    1 197 835        4/2002
GB        2367530 A    *  4/2002

* cited by examiner

*Primary Examiner* — Fayyaz Alam
(74) *Attorney, Agent, or Firm* — The Farrell Law Firm, P.C.

(57) ABSTRACT

A keypad assembly for a portable radiotelephone and a method for controlling the keypad assembly. The keypad assembly includes: a printed circuit board having a plurality of metal domes; a keypad rubber disposed on the printed circuit board and having bosses formed integratedly on the positions corresponding to the respective metal domes; a sensing means disposed on the keypad rubber; and a key button part disposed on the sensing means, such that a touch screen function using the sensing means or a key button function electrically contacting the metal domes is selectively used according to the mode of the radiotelephone.

8 Claims, 5 Drawing Sheets

KEYPAD ASSEMBLY FOR PORTABLE RADIOTELEPHONE AND METHOD OF CONTROLLING THE SAME

PRIORITY

This application claims priority to an application entitled "KEYPAD ASSEMBLY FOR PORTABLE RADIOTELEPHONE AND CONTROLLING METHOD THEREOF" filed before the Korean Intellectual Property Office on Oct. 18, 2002 and assigned as Serial No. 2002-63778, the contents of which are incorporated herein by reference.

BACKGROUND OF THE INVENTION

1. Field of the Invention

The present invention relates to a keypad assembly for a portable radiotelephone, and more particularly, to a keypad assembly for a portable radiotelephone wherein a keypad can also be used as a touch screen panel, and a method of controlling the same.

2. Description of the Prior Art

Recently, owing to the development of the electronic communication industry, mobile radio communication equipment such as cellular phones, PDAs, and portable PCs have been rapidly developed to transmit or receive data and to use content in various multimedia environments. In particular, in the portable radiotelephone widely known as cellular phone, the display device has been widened in many models for the user's convenient carrying and the accommodation of various functions. It has also been found that a keypad assembly used as a key input means can accommodate various functions through a mode shift.

A portable radiotelephone can employ a touch screen mode or a keypad assembly as the key input means for inputting data or the telephone numbers of other parties. In particular, the keypad assembly employs a method of applying a signal, wherein the bosses, which are formed under the keypad rubber with a plurality of key buttons integrally formed, press the metal domes mounted on the printed circuit board of the body. The metal domes are then electrically contacted with the carbon contacts of the printed circuit board.

In a method wherein the touch screen mode is employed instead of the keypad assembly, a user employs input means such as a stylus pen.

The convenience of using a radiotelephone is furthered by employing the keypad assembly and simultaneously employing a display for a touch screen.

Recently, in some models of radiotelephone, a dummy keypad with a keypad printed thereon has been hingedly installed between body and folder or between body and flip, while the above touch screen mode has been left unchanged. When using the dummy keypad of the radiotelephone, the dummy keypad is laid on the touch screen, and then the numeral buttons are pressed. Thus, the inconvenience of manipulating a stylus pen to use the touch screen can be avoided.

As described above, however, in the case of using a touch screen which does not occupy the body of the radiotelephone, there may be the inconvenience of using a stylus pen. Further, in the case of using the dummy keypad, the radiotelephone is thickened by the thickness of the dummy keypad, which is contrary to the beneficial trend towards thinner and lighter radiotelephones. Also, in the case of using the dummy keypad, there is a problem of moving the dummy keypad to the display.

SUMMARY OF THE INVENTION

Accordingly, the present invention is directed to a keypad assembly for a portable radiotelephone which substantially obviates said problems due to limitations and disadvantages of the related art.

An object of the present invention is to provide a keypad assembly for a portable radiotelephone wherein a keypad can also be used as a touch screen panel, and a method of controlling the same.

Another object of the present invention is to provide a keypad assembly for a portable radiotelephone wherein a keypad can also be used as a touch screen panel without increasing the volume of the radiotelephone, and a method of controlling the same.

Further, another object of the present invention is to provide a keypad assembly for a portable radiotelephone and a method of controlling the same, in which when the keypad assembly is used for a touch screen function, it is unnecessary to employ an input means such as a stylus pen.

Still another object of the present invention is to provide a keypad assembly for a portable radiotelephone and a method of controlling the same, in which a keypad is provided with a sensor so that it can be used as a touch screen panel when shifting a mode.

To achieve the above objects and other advantages, according to one aspect of the present invention, there is provided a keypad assembly for a portable radiotelephone, which includes: a printed circuit board having a plurality of metal domes; a keypad rubber disposed on the printed circuit board and having bosses formed integratedly on positions corresponding to the respective metal domes; a sensing means disposed on the keypad rubber; and a key button part disposed on the sensing means, whereby a touch screen function using the sensing means or a key button function electrically contacting the metal domes is selectively used according to the mode of the radiotelephone.

In other words, the present invention may employ the key button function, or may instead employ the keypad as the touch screen by shifting the mode. This is a concept contrary to a conventional numeral keypad displayed on a touch screen, and requires no separate input means such as a stylus pen. In addition, the entire keypad may be used as the touch screen by mode shifting.

The key button assembly for a portable radiotelephone having the above constitution includes an input unit having a keypad that can also be used as a touch screen panel; a control unit for generating a control signal to operate the input unit as the touch screen panel or as the keypad depending on the user's setting; and a driving power supply unit for exclusively providing a driving power to the touch screen panel or the keypad according to the control signal from the control unit.

The key button assembly may further include a character recognition unit for converting a coordinate value produced from the input unit by user's contacting with the upper surface of the panel into a character code, if the input unit serves as the touch screen panel. The key button assembly may also further comprise a display unit for displaying a character according to the character code from the character recognition unit on a display window. The display unit may be a display of the radiotelephone employing an LCD module.

According to another aspect of the present invention, in a portable radiotelephone including a keypad assembly that can be used as a touch screen, a method of exclusively operating the touch screen panel or the keypad includes the steps of: determining whether or not an input mode shift key is inputted; shifting an input mode into a touch screen input mode if the input mode shift key is inputted; cutting off a driving power supplied to the keypad, and supplying the driving power to the touch screen panel.

It is to be understood that both the foregoing general description and the following detailed description of the present invention are exemplary and explanatory and are intended to provide further explanation of the invention as claimed.

BRIEF DESCRIPTION OF THE DRAWINGS

The accompanying drawings, which are included to provide a further understanding of the invention and are incorporated in and constitute a part of this application, illustrate embodiment(s) of the invention and together with the description serve to explain the principle of the invention. In the drawings.

DETAILED DESCRIPTION OF THE PREFERRED EMBODIMENTS

The present invention will now be explained with reference to the accompanying drawings.

Figure 1:
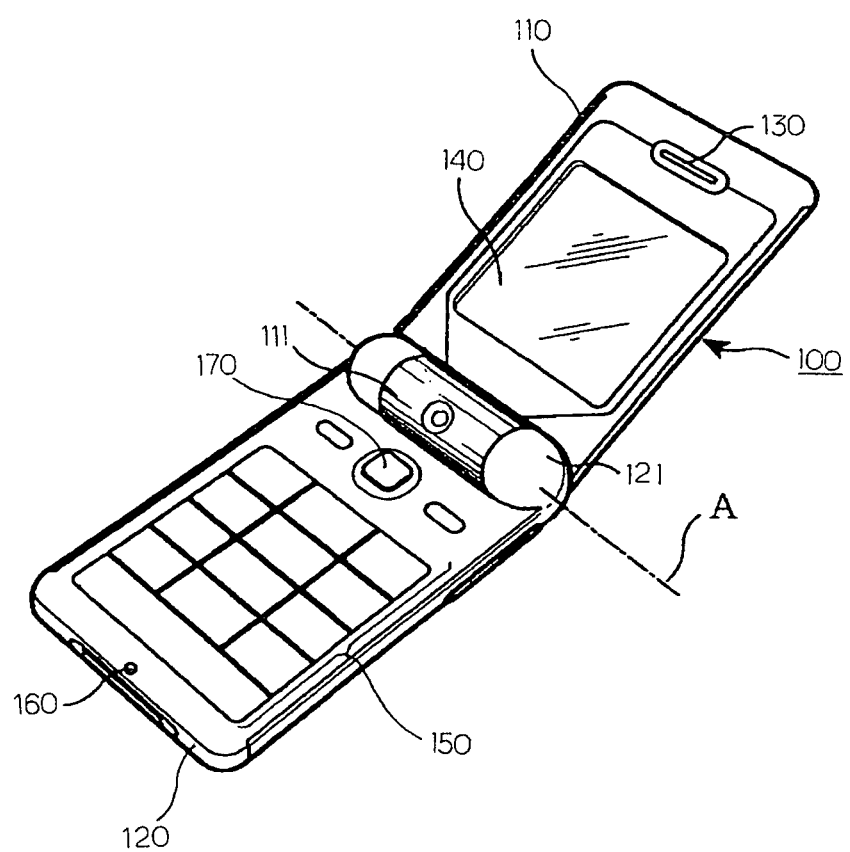
FIG. 1 is a perspective view of a portable radiotelephone according to an embodiment of the present invention.

FIG. 1 is a perspective view of the portable radiotelephone according to one preferred embodiment of the present invention, in which the portable radiotelephone 100 consists of a main body 120 and a sub-body 110 hinged to the main body 120. The sub-body 110 hinged to the main body 120 may be a folder, a flip or a flip of flip-up type radiotelephone. The folder type radiotelephone is illustrated as shown in FIG. 1.

Specifically, the folder 110 is hingedly coupled to the main body 120 by a center hinge arm 111 and a side hinge arm 121 in such a way that it may rotate on an axis 'A' in FIG. 1. An ear piece 130 serving as a loudspeaker is located in the upper position of the folder 110, and a display 140 is under the ear piece. An LCD module may be used as the display 140.

A keypad assembly 150 with a plurality of numeral key buttons is positioned on the main body 120, and a microphone 160 is positioned under the keypad assembly 150.

Figure 3:
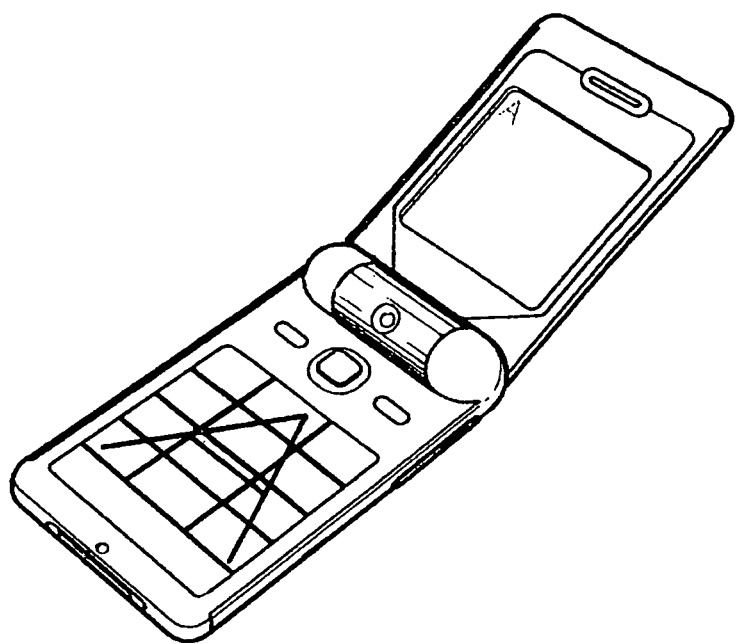
FIG. 3 is a perspective view of the portable radiotelephone in which the keypad assembly is used as the touch screen panel.

In the keypad assembly 150, key buttons 156 are substantially on the same plane, and a number or character (not shown) is printed on each of key buttons 156. Preferably, the key buttons 156 may be integrally formed with each other, and the key buttons may be positioned in such a manner that no spacing is therebetween, to serve as a touch screen. In addition, a mode shift button 170 may be provided on the upper portion of the keypad assembly 150. In accordance with the operation of the mode shift button 170 by a user, the keypad assembly 150 may be used as a keypad or as a touch screen excluding the key button function. FIG. 3 is a view illustrating an example in which the keypad assembly of the portable radiotelephone of the present invention is used as a touch screen panel. If the user inputs a character (for example, "A") on the surface of the keypad assembly using his/her finger or other means, the inputted character is displayed on the display.

Figure 2:
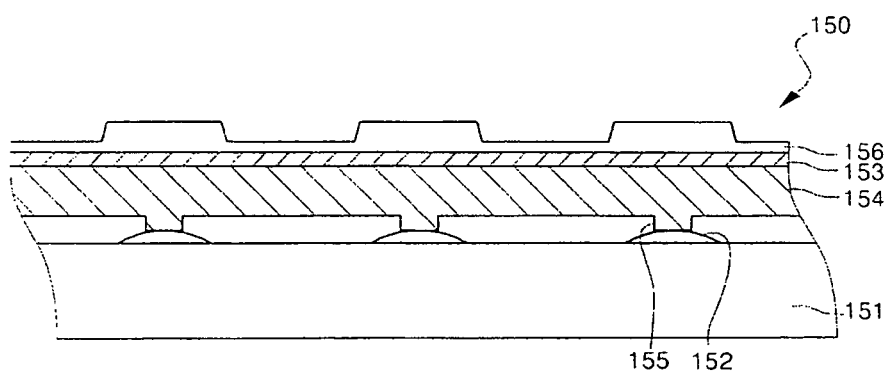
FIG. 2 is a partial cross-sectional view of a keypad assembly according to an embodiment of the present invention.

FIG. 2 is a partial cross-sectional view of the keypad assembly 150 according to an embodiment of the present invention. The main body 120 is provided with a printed circuit board 151 having a plurality of metal domes 152. If the keypad assembly 150 of the radiotelephone is operated in the key button mode, the metal dome 152 functions to recognize the numeral buttons by bringing the carbon contacts of the printed-circuit board 151 into electrical contact with each other. Of course, the printed circuit board 151 can be replaced by a flexible printed circuit board (FPC) having metal domes, depending upon the kind and shape of the terminal.

A keypad rubber 154 is disposed on the printed circuit board 151. Bosses 155 can be protrudingly formed under the keypad rubber 154. The bosses 155 are disposed at the predetermined positions corresponding to the metal domes 152 formed on the printed circuit board 151. Thus, the bosses 155 press the metal domes 152 during an operation of the keypad rubber 154.

A sensing means is disposed on the keypad rubber 154. A capacitive sensor 153 can be used as the sensing means. The capacitive sensor 153 is a sensor used for the touch screen panel, and it is widely known for detecting variation of capacitance occurring in the atmosphere by the interfacial polarization between a detecting electrode and the surface of an object as the object is approaching. A piezo-electric capacitive sensor may also be employed.

A plurality of key buttons 156 are disposed on the sensing means. The key buttons 156 can be provided with separate buttons with numerals printed thereon. Preferably, a film sheet on which numerals or characters are printed with a regular interval is used for the key buttons. However, the present invention is not limited to using a film sheet. In addition, in the case of separate buttons, it is preferable to allow no spacing between the buttons. Preferably, the key buttons 156 are substantially on the same plane for convenient use in a touch screen mode.

Figure 4:
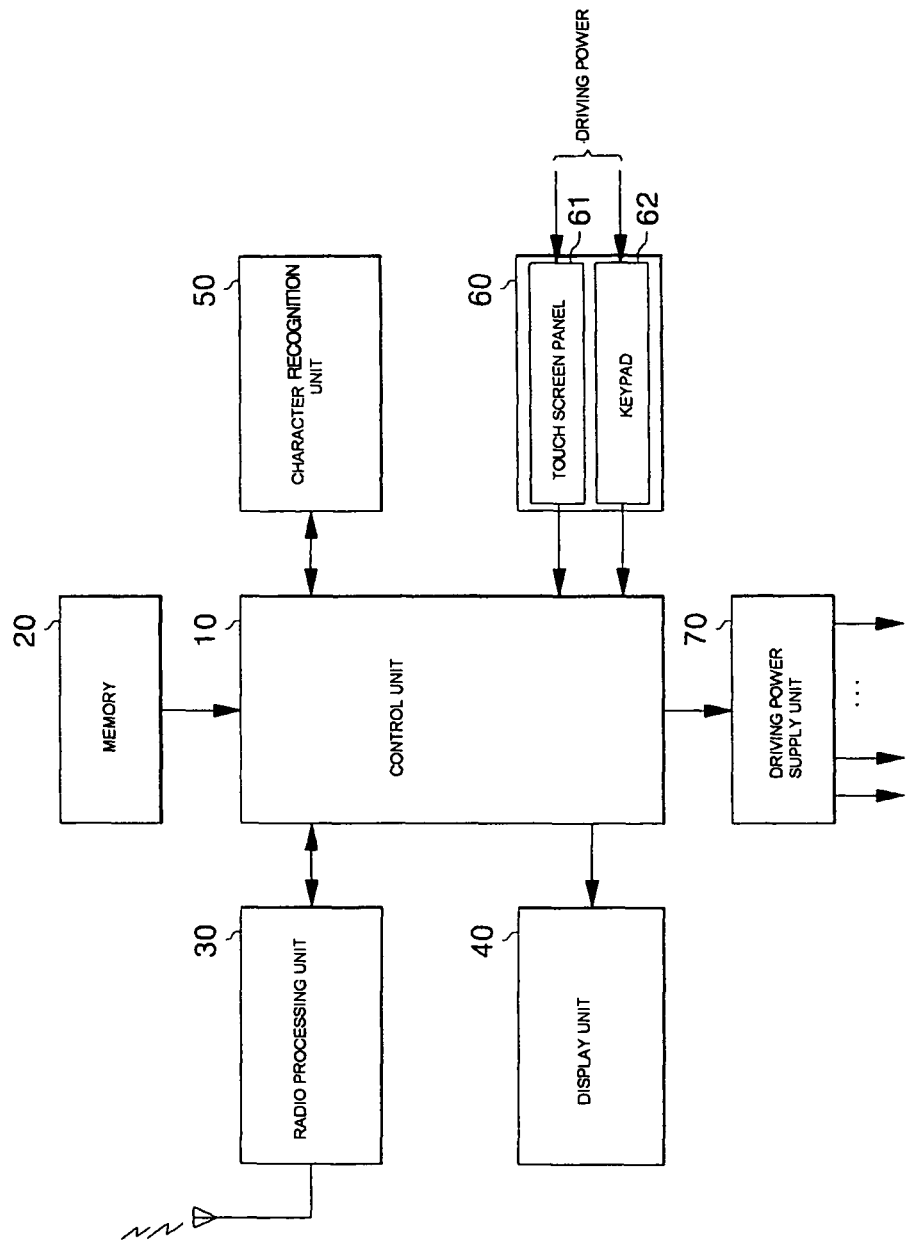
FIG. 4 is a block diagram of a portable radiotelephone according to an embodiment of the present invention.

FIG. 4 is a block diagram of the portable radiotelephone according to one preferred embodiment of the present invention.

Referring to FIG. 4, the operation of the portable radiotelephone is controlled by a control unit 10. In particular, according to the embodiment of the present invention, the control unit 10 controls an input unit 60 to function as a touch screen panel or as a keypad according to the set input mode. The control unit 10 is generally a one-chip microprocessor, and may be commercially available as a mobile station modem (MSM) chip manufactured by Qualcomm Inc.

A memory 20 includes a volatile memory (e.g., RAM) and a nonvolatile memory (e.g., flash memory and EEPROM), and stores program data for controlling the operation of the portable radiotelephone, initial service data, and temporary data made by the operation of the portable radiotelephone.

A radio processing unit 30 implements communication between a base station and a portable radiotelephone. Specifically, the radio processing unit 30 converts a high frequency signal received through an antenna into a baseband signal via an intermediate frequency, and converts the baseband signal into a digital signal to output it to the control unit 10. The radio processing unit 30 converts the digital signal outputted from the control unit 10 into an analog signal, and converts the analog baseband signal into the high frequency signal via the intermediate frequency to transmit it through the antenna.

A display unit 40 displays the general state of the portable radiotelephone and the information inputted by a user on a display window (e.g., liquid crystal display) under the control of the control unit 10.

A driving power supply unit 70 generates DC voltage used in the portable radiotelephone, and is adapted to provide or to cut off the DC voltage to a corresponding component under the control of the control unit 10.

The input unit 60 is a user input device with a touch screen panel 61 and a keypad 62 formed integrally. According to the present invention, the touch screen panel 61 or the keypad 62 is operated exclusively from each other according to the set mode. This may be achieved by cutting off the power supplied to the touch screen panel 61 or to the keypad 62. In the touch screen input mode, the input unit 60 functions as a touch screen panel to provide the control unit 10 with coordinate values produced by the contact of the upper surface of the panel with a user's hand or writing instrument. Then, the control unit 10 provides a character recognition unit 50 with the coordinate values. In the keypad input mode, the input unit 60 functions as a keypad to provide the control unit 10 with the key input values produced when the user applies pressure to the keys. Then, the control unit 10 analyzes the key input values, and outputs the resulting characters to the display unit 40 to display it on the display window. The detailed constitution of the input unit 60 will now be described with reference to the accompanying drawings.

The character recognition unit 50 has a conversion table to convert the coordinate value produced from the touch screen panel 61 into a character code, and reads the character code corresponding to the coordinate value from the control unit 10 and outputs the character code to the control unit 10. The control unit 10 outputs the character code to the display unit 40 to display it on the display window.

Figure 5:
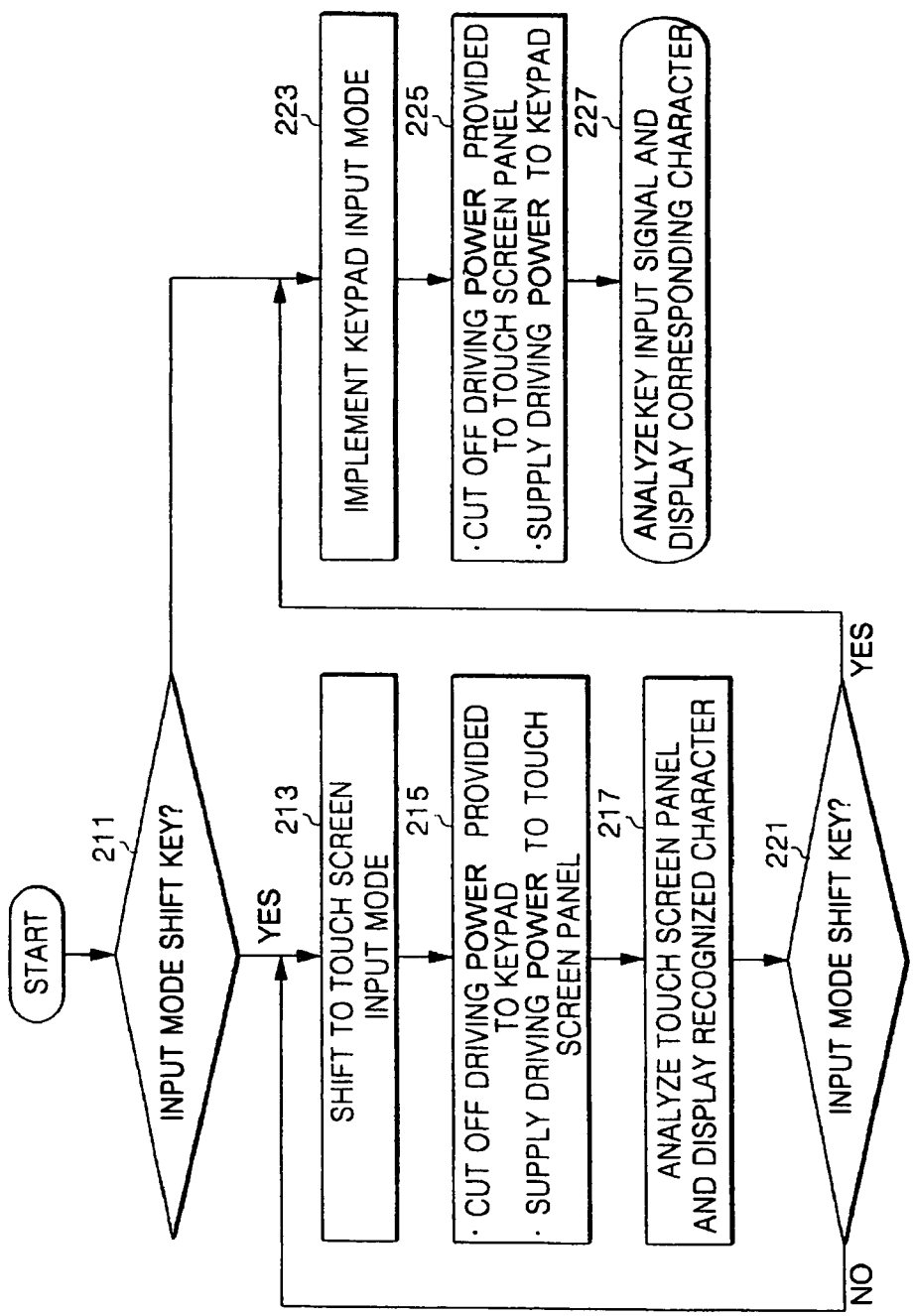
FIG. 5 is a flowchart illustrating a control process of exclusively operating a touch screen or a keypad according to an embodiment of the present invention.

FIG. 5 is a flowchart illustrating a control process for exclusively operating the touch screen or the keypad in the portable radiotelephone with the touch screen and the keypad formed integrally according to an embodiment of the present invention. In the radiotelephone of the present embodiment, the input mode of the radiotelephone is initially set to the keypad input mode, and the input mode of the radiotelephone is automatically reset to the initial keypad input mode if the radiotelephone is closed and then opened during the operation of the touch screen input mode. This is to allow users to easily use the basic functions of the telephone. However, even if the radiotelephone is neither opened nor closed, if no key input is carried out in the touch screen input mode during a predetermined time, the radiotelephone may be automatically reset to the keypad input mode.

Referring to FIGS. 4 and 5, in step S211, the control unit 10 determines whether or not the input mode shift key is inputted by the user. Preferably, the input mode shift key is embodied as a hot key so as to easily achieve the mode shift. The current input mode may be displayed at a specific region of the display window, so that the user can easily recognize it. If input of the input mode shift key is detected, the control unit 10 proceeds to step S213 to shift the current input mode to the touch screen input mode. In step S215, the control unit 10 cuts off the driving power supplied to the keypad 62 and supplies the driving power to the touch screen panel 61. In step S217, the control unit 10 provides the character recognition unit 50 with the coordinate values inputted from the touch screen panel 61 and instructs the character recognition unit 50 to analyze the coordinate values to produce character codes. The control unit 10 provides the display unit 40 with the resulting character codes outputted from the character recognition unit 50, and the display unit 40 displays the character codes on the display window. In step S221, the control unit 10 determines whether or not the input mode shift key is inputted. If the input mode shift key is not inputted, the touch screen input mode is maintained.

If the input mode shift key is not inputted in step S211, or the input mode shift key is inputted after carrying out the touch screen input mode in step S221, the control unit 10 proceeds to step S223 to carry out the keypad input mode. Thus, in step S225, the control unit 10 cuts off the driving power supplied to the touch screen panel 61 and supplies the driving power to the keypad. In step S227, the control unit 10 analyzes the key input values inputted from the keypad 62 and provides the resulting character codes to the display unit 40. The display unit 40 displays the character codes on the display window.

In the above description of the present invention, since the keypad assembly includes a keypad which also serves as a touch screen by use of a capacitive sensor, the entire keypad assembly can be used as a touch screen, thereby requiring no separate input means because of a wide input space. In addition, since it is not necessary to use the dummy keypad in a double structure, the radiotelephone is prevented from increasing in volume. The conversion between the keypad and the touch screen may be easily carried out through a simple manipulation of the mode shift key.

The foregoing embodiments are merely exemplary and are not to be construed as limiting the present invention. The present invention's teachings can be readily applied to other types of apparatuses. The description of the present invention is intended to be illustrative, and not to limit the scope of the claims. Many alternatives, modifications, and variations will be apparent to those skilled in the art.

What is claimed is:

1. A keypad assembly for a portable radiotelephone, comprising:
   a printed circuit board having a plurality of metal domes;
   a keypad rubber disposed on the printed circuit board and having bosses formed integrally on the positions corresponding to the plurality of metal domes;
   a sensing means disposed on the keypad rubber;
   a key button part disposed on the sensing means, the key button part integrating a keypad and a touch screen panel by having a plurality of key buttons being integrally formed with each other and being positioned such that top planar surfaces of the plurality of key buttons form a single, substantially planar touch screen panel with no spacing in between the top planar surfaces of adjacent keys among the plurality of key buttons, for functioning in one of a keypad mode and a touch screen panel mode;
   a power supply unit supplying power to the keypad and cutting off power to the touch screen panel in the keypad mode; and
   an input mode shift key shifting from one of the keypad mode and the touch screen panel mode to the other mode.

2. The keypad assembly for a portable radiotelephone according to claim 1, wherein the sensing means is a capacitive sensor.

3. The keypad assembly for a portable radiotelephone according to claim 1, wherein the key button part is a film sheet attached to the upper surface of the sensing means, the film sheet having a plurality of numeral keys printed thereon.

4. A portable radiotelephone comprising:
   an input unit integrating a keypad and a touch screen panel by having a plurality of key buttons being integrally formed with each other and being positioned such that top planar surfaces of the plurality of key buttons form a single, substantially planar touch screen panel with no spacing in between the top planar surfaces of adjacent keys among the plurality of key buttons, for functioning in one of a keypad mode and a touch screen panel mode;

a control unit for generating a control signal to operate the input unit exclusively as one of the touch screen panel and the keypad according to an input mode predetermined by a user;

an input mode shift key shifting the input unit from one of the keypad mode and the touch screen panel mode to the other mode; and a power supply unit supplying power to the keypad and cutting off power to the touch screen panel in the keypad mode.

5. The portable radiotelephone according to claim 4, further comprising a character recognition unit for converting a coordinate value into a character code when the input unit functions as the touch screen panel, the coordinate value being produced from the input unit by a user's contacting an upper surface of the touch screen panel.

6. The portable radiotelephone according to claim 5, further comprising a display unit for displaying a character corresponding to the character code from the character recognition unit.

7. A method of inputting data to a portable radiotelephone in one of a keypad input mode and a touch screen panel input mode, the portable radiotelephone having a keypad physically integrating a touch screen panel, comprising the steps of:

provisioning the keypad with a plurality of key buttons being integrally formed with each other and being positioned such that top planar surfaces of the plurality of key buttons form a single, substantially planar touch screen panel with no spacing in between the top planar surfaces of adjacent keys among the plurality of key buttons;

setting the portable radiotelephone initially in the keypad input mode and supplying power to the keypad and cutting off power to the touch screen panel;

determining whether or not an input mode shift key is inputted, the input mode shift key shifting from one of the keypad input mode and the touch screen panel input mode to the other mode;

shifting input mode from the keypad input mode to the touch screen input mode when the input mode shift key is inputted; and cutting off a driving power supplied to the keypad, and supplying the driving power to the touch screen panel.

8. The method according to claim 7, further comprising the steps of:

determining whether or not the input mode shift key is inputted;

shifting the input mode from the touch screen input mode to the keypad input mode when the input mode shift key is inputted; and cutting off the driving power supplied to the touch screen panel, and supplying the driving power to the keypad.

* * * * *